United States Patent
Matsumura

[11] Patent Number: 5,813,869
[45] Date of Patent: Sep. 29, 1998

[54] IC SOCKET AND GUIDE MEMBER

[75] Inventor: Shigeru Matsumura, Ohsato-gun, Japan

[73] Assignee: Advantest Corporation, Tokyo, Japan

[21] Appl. No.: 751,330

[22] Filed: Nov. 18, 1996

[30] Foreign Application Priority Data

Nov. 20, 1995 [JP] Japan .................................. 7-301402

[51] Int. Cl.⁶ .................................................. H01R 9/09
[52] U.S. Cl. ............................................................ 439/72
[58] Field of Search ............................... 439/70, 71, 72, 439/73

[56] References Cited

U.S. PATENT DOCUMENTS

| | | | |
|---|---|---|---|
| 4,433,886 | 2/1984 | Cassarly et al. | 439/71 |
| 4,552,422 | 11/1985 | Bennett et al. | 439/70 |
| 5,078,626 | 1/1992 | Matsuoka et al. | 439/71 |
| 5,273,442 | 12/1993 | Laub | 439/73 |
| 5,352,131 | 10/1994 | Nagumo | 439/70 |

*Primary Examiner*—Neil Abrams
*Assistant Examiner*—T. C. Patel
*Attorney, Agent, or Firm*—Staas & Halsey

[57] ABSTRACT

An IC socket capable of being used commonly with various ICs having different sizes is provided. Four insulation blocks 12A, 12B, 12C and 12D which may be assembled together into a generally rectangular framing are prepared. Contact arrays 11A, 11B, 11C and 11D of the IC socket to be contacted by the leads on the respective sides of a surface-mounted type IC are separately supported by the four insulation blocks, respectively. The four insulation blocks have positioning lugs 15 formed on the bottom surfaces thereof which are adapted to engage with mating through-holes 14 formed through the insulation substrate 13 to mount the four insulation blocks to the insulation substrate 13 in the form of a generally rectangular framing.

2 Claims, 2 Drawing Sheets

IC SOCKET AND GUIDE MEMBER

BACKGROUND OF THE INVENTION

1. Field of the Invention

The present invention relates to an IC socket suitable for use in an IC (semiconductor integrated circuit) testing apparatus (commonly called IC tester) and a guide member adapted to fit over the IC socket to insure that ICs be guided and positioned onto the IC socket.

2. The Prior Art

Various surface-mounted types of ICs, represented by QFP (Quad Flat Package) for instance, having leads projecting from four sides of the package are in practical use. When testing this surface-mounted type of IC by an IC testing apparatus for example, the IC package in its horizontal orientation is picked up by a vacuum pick-up means and carried by an X-Y transport means (horizontal transport means for transporting elements in X and Y directions in a horizontal plane) while attracted by the vacuum pick-up means to a testing section where the IC to be tested is placed on an IC socket provided in the testing section with the leads of the IC brought into electrical contact with contacts of the IC socket.

FIG. 3 illustrates one example of the construction of a prior art IC socket used in an IC testing apparatus. This IC socket comprises an insulation body 2 of generally rectangular shape in plan view having rectangularly arranged four ridges in a recess formed in the body. A multiplicity of contacts are implanted in the recess such that portions thereof extend transversely across the respective ridges whereby contact arrays 1 each comprising a number of contacts spaced apart with a predetermined pitch (at regular intervals) on each of the ridges are provided. The insulation body 2 has guide posts 3 upstanding therefrom adjacent opposite ends of the contact array on each of the ridges, that is, at each of the corners of the generally rectangular entire arrangement of contact arrays. It should be noted that the ridges are sized so that they are lower than the top surface of the insulation body 2. Hence, the contact arrays 1 lie below the top surface of the insulation body 2. It is also to be understood that the pitch between the contacts of each contact array 1 is chosen to be equal to the spacings (pitch) of leads of an IC to be contacted with the contact array 1.

While the spacings (pitch) of leads along each side of the IC are strictly prescribed, there is a certain allowable range in the dimensions of an IC package. The various IC manufacturers thus determine the package dimensions within the allowable range. On the other hand, the guide posts 3 of the IC socket are positioned such that they are to accurately match the size of the package. For this reason, in order to test ICs having varying dimensions within the allowable range, it is required to prepare various IC sockets having guide posts 3 prescribed for their positions for different sizes of IC packages. In addition, the difference in the package size requires that the spacings L1 and L2 between the opposed contact arrays 1 be slightly varied to accommodate differently sized packages even they have the same number of leads with the same pitch. It is thus to be appreciated that the inability to use the same IC socket commonly for even ICs having an equal number of leads with the same pitch greatly increases the number of types of IC sockets required to be prepared, resulting in an undesirable increase in the cost of manufacture.

Moreover, since the prior art IC socket has contact arrays 1 integrally incorporated in the insulation body 2, it would not be repairable even if any one or more contacts of the contact arrays should fail in contact or be broken, for example. This means that the entire IC socket must be replaced with a new one, resulting in an increase in the running cost. As a consequence, the maintenance cost of the IC testing apparatus or other apparatus utilizing this type of IC socket has been undesirably increased.

SUMMARY OF THE INVENTION

An object of the present invention is to provide an inexpensive IC socket which is capable of readily accommodating a variation in the size of IC packages.

An another object of the present invention is to provide an inexpensive guide member adapted to fit over an IC socket and able to accurately position an IC on the IC socket.

According to the present invention, in an IC socket having contacts brought into contact with the leads projecting from each of four sides of a surface-mounted type of IC package, the contacts brought into contact with the IC leads are divided into four groups, each for contacts coming into contact with the leads on one of the four sides of the IC, and the four groups of contacts are supported in electrical insulation by four separate respective insulation blocks. These four insulation blocks have such shapes that they can form a generally quadrilateral framing when they are assembled together. These four insulation blocks have positioning means provided on their bottom surfaces, these positioning means being configured to be engageable with mating positioning means formed in an insulation substrate so as to define arrays of contacts arranged in the form of a generally quadrilateral framing to be contacted with the leads on the four sides of the IC.

With the construction described above, a certain variation in the size of the surface-mounted type IC may be accommodated by varying the mounting positions of the four insulation blocks with respect to the insulation substrate, to thereby insure that the leads on the four sides of the IC are accurately contacted with the contacts of the IC socket. Accordingly, it will be appreciated that the four insulation blocks can be used commonly with ICs having more or less different dimensions. In other words, four insulation blocks of common construction may be arranged to form an IC socket for accommodating any differently sized IC.

In addition, since the contact arrays each for the leads on each side of the IC are separated and supported on the respective independent insulation blocks, even if some of the contacts should fail in contact or be broken, it would be required to replace only the defective insulation block, resulting in saving the cost.

In another aspect of the present invention, a guide member is provided which is adapted to fit over the IC socket constructed as described above. The guide member is a monolithic part molded from electrically insulating resinous material comprising a plate-like insulation element having a generally quadrilateral recess extending upwardly from the bottom thereof for receiving the four insulation blocks mounted to form a generally quadrilateral framing on the insulation substrate of the IC socket, a generally quadrilateral opening formed through the recess for exposing at least the top portions of the contact arrays insulatively supported by the respective insulation blocks, and guide posts upstanding from the insulation element at four corners of the opening for defining the position of an IC placed on the IC socket.

Since the guide member constructed as described above is inexpensive to manufacture, there would be virtually no problem involved in preparing a number of different guide members adapted for a number of different IC sockets assembled by varying the mounting positions of the insulation blocks to accommodate various sized ICs. And yet the guide member fitted over the IC socket provides the great advantage of accurately guiding and positioning the IC onto the IC socket.

DETAILED DESCRIPTION OF THE PREFERRED EMBODIMENTS

Figure 1:
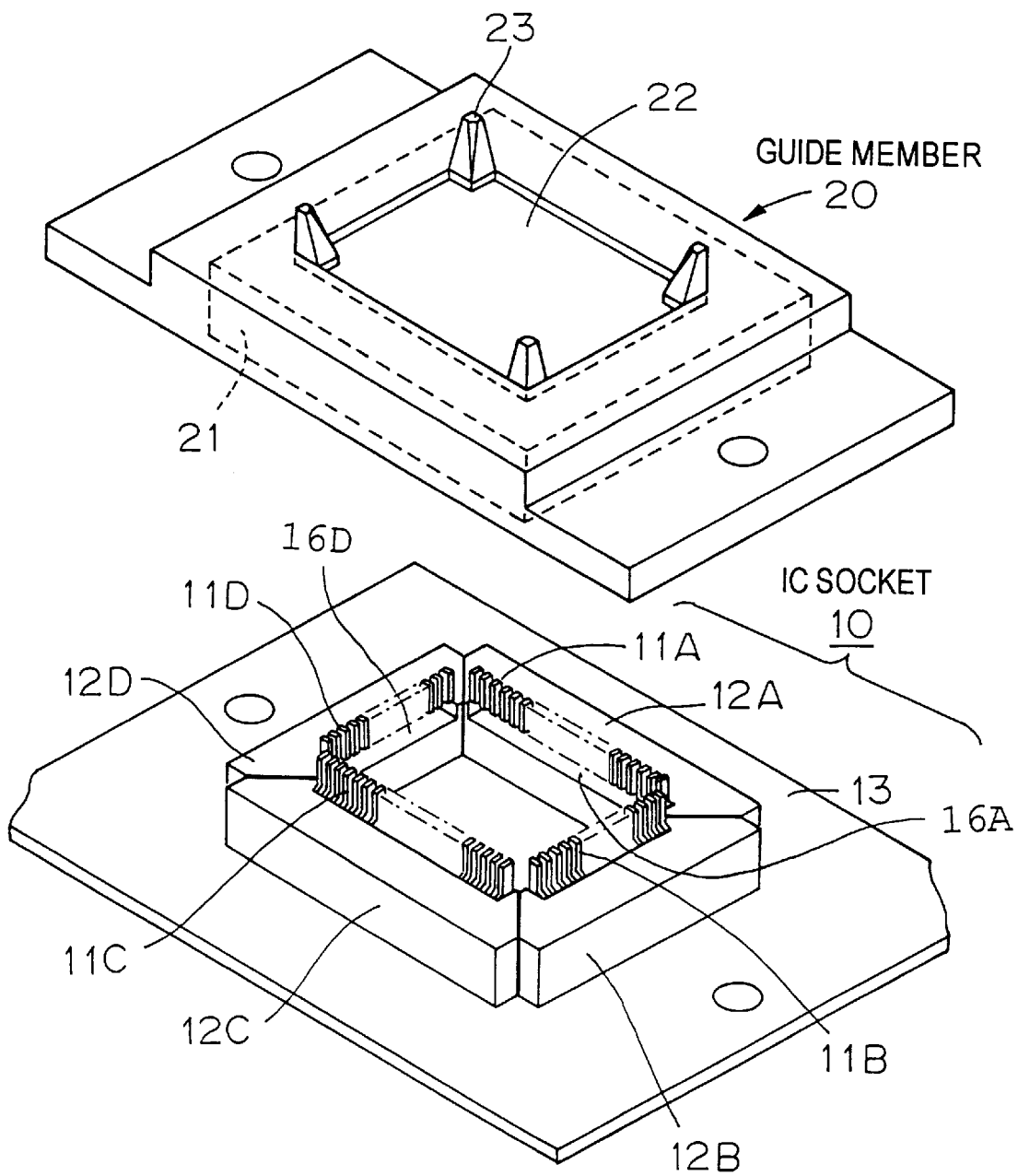
FIG. 1 is an exploded perspective view illustrating the construction of one embodiment of the IC socket and guide member according to the present invention.

One embodiment of the IC socket and guide member according to the present invention will be described in detail with reference to FIGS. 1 and 2.

The IC socket 10 according to the present invention basically comprises four insulation blocks 12A, 12B, 12C and 12D, each being of isosceles trapezoidal shape in plan view, which may be assembled together into a generally rectangular framing, contact arrays 11A, 11B, 11C and 11D, each including a number of contacts arranged with a predetermined pitch longitudinally along the minor side of two parallel sides of the associated one of the trapezoidal insulation blocks 12A, 12B, 12C and 12D and supported in electrical insulation by the insulation block, and an insulation substrate 13 supporting the four insulation blocks 12A–12D in the form of an assembly defining a generally rectangular framing.

The insulation blocks 12A–12D are each formed with a longitudinally elongated recess 16A, 16B, 16C, 16D (the recesses 16B and 16C are invisible) along the inner side thereof (the minor side of the trapezoid in the illustrated embodiment) when assembled into a framing, and the contacts of each of the contact arrays 11A–11D are arranged in each of the elongated recess at predetermined intervals. It is to be noted that the contacts of the contact arrays 11A–11D are mounted in the insulation blocks 12A–12D with the upper portions of the contacts projecting upwardly above the top surface of the blocks so that upon an IC being placed onto the IC socket 10, the IC leads are brought into electrical contact with the top ends of the contacts.

The insulation blocks 12A–12D are individually mounted to the insulation substrate 13 to define a generally rectangular framing. As the mounting means in this embodiment, the insulation substrate 13 is formed with through-holes 14 at predetermined positions as shown in FIG. 2 while the insulation blocks 12A–12D (only the insulation block 12A is representatively shown in FIG. 2) have mating lugs 15 extending downwardly from the bottom surfaces thereof. The lugs 15 are fitted into the holes 14 in the insulation substrate 13 and secured thereto as by adhesives to thereby fix the insulation block to the insulation substrate 13.

In this embodiment, the through-holes 14 formed in the insulation substrate 13 for each of the insulation blocks are positioned such that the distance W1 between the through-holes for a pair of opposed insulation blocks 12B and 12D and the distance W2 between the through-holes for a pair of opposed insulation blocks 12A and 12C are equal to the distances between the lead arrays on the opposed sides of an IC being tested, respectively. The lugs 15 extending from the bottom surfaces of the insulation blocks 12A–12D are disposed substantially at positions opposing (directly beneath) the respective contact arrays 11A–11D. When the insulation blocks 12A–12D are mounted to the insulation substrate 13 (when a generally rectangular framing is formed as shown in FIG. 1), the contacts of the contact arrays 11A–11D will have the same pitch as that of the leads on the respective sides of the IC package while at the same time the spacings between the opposed contact arrays will be equal to those between the opposed lead arrays of the IC package.

While each of the insulation blocks 12A–12D is provided at its bottom surface with two lugs 15 longitudinally spaced apart at a predetermined interval and the insulation substrate 13 is formed with as many through-holes 14 as the lugs 15 at the spacing equal to that between the lugs 15 in this embodiment, it is obvious that the number of the lugs 15 and through-holes 14 is not limited to two. Neither is it necessarily required that the lugs 15 formed on the bottom surfaces of the insulation blocks 12A–12D be at positions opposing the associated contact arrays 11A–11D, but they may be disposed at any desired position. In addition, lugs may be formed on the insulation substrate 13 and blind holes may be formed in each of the insulation blocks, or alternatively other mounting means than the lug-and-hole means may be employed.

As described above, the IC socket according to the present invention is completed by mounting the four insulation blocks 12A–12D to the insulation substrate 13 to form a generally rectangular framing. In the present invention, a guide member 20 is fitted over the IC socket 10 as shown in FIG. 1 to guide and position an IC onto the IC socket 10. The guide member 20 will be described below.

Figure 2:
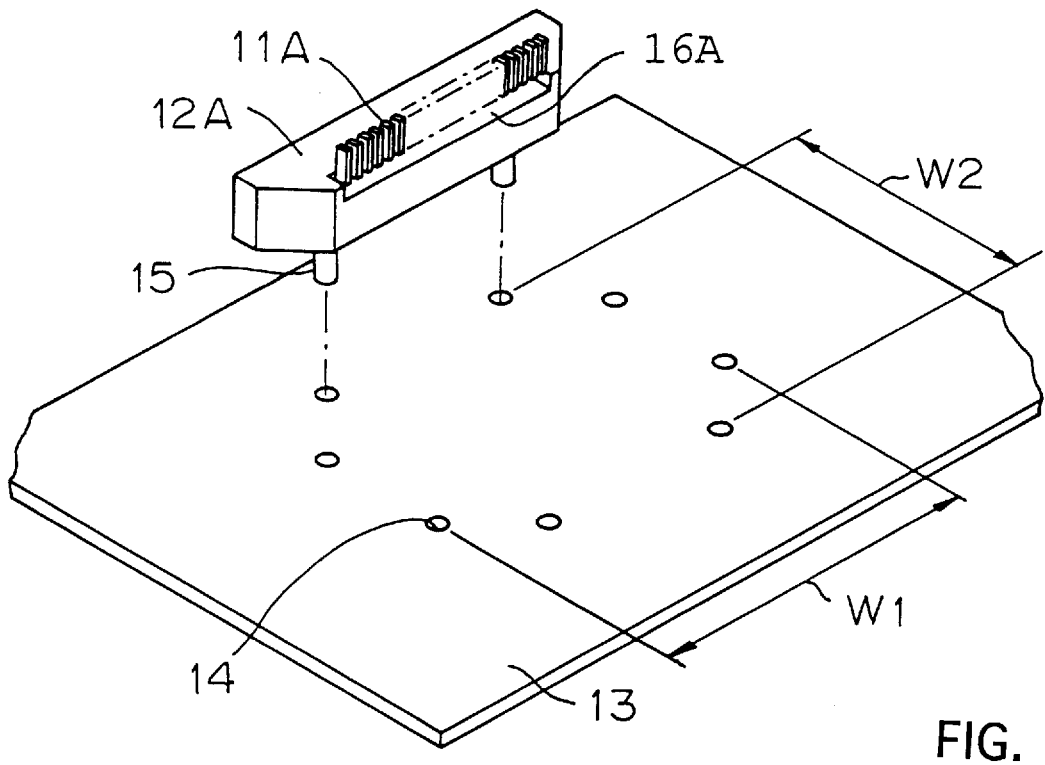
FIG. 2 is a perspective view illustrating the spacings between the holes formed through the insulation substrate of the IC socket shown in FIG. 1.
Figure 3:
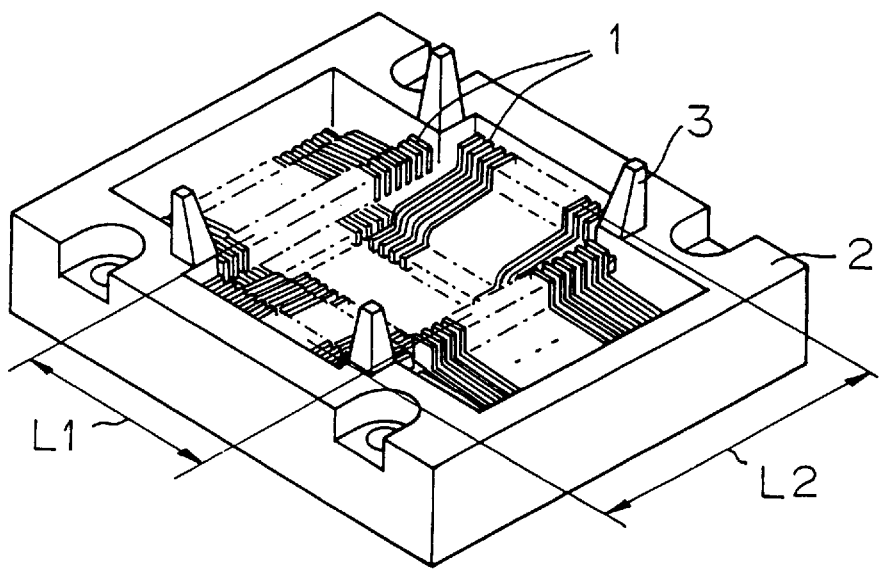
FIG. 3 is a perspective view illustrating one example of the prior art IC socket.

As shown in FIG. 1, the guide member 20 comprises a plate-like element of a generally rectangular shape in plan view having opposite thinner end portions and a central thicker portion extending between the opposite end portions. A generally rectangular recess 21 extends upwardly from the bottom of the central thicker portion and is shaped and sized so as to receive the framing consisting of the four insulation blocks 12A–12D on the insulation substrate 13. An opening 22 corresponding in size to the outer dimension of an approximate rectangle defined by those portions of the contacts arrays 11A–11D upstanding from the respective insulation blocks 12A–12D is formed through the recess 21 so that when the guide member 20 is fitted over the IC socket 10, the top portions of the contact arrays 11A–11D are exposed to the exterior through the opening 22.

Guide posts 23 for accurately positioning an IC being placed onto the IC socket 10 are formed integrally with the plate-like element by molding at the inside of the four corners of the generally rectangular opening 22 and extend upwardly therefrom. The guide member 20 may be integrally molded from resinous material, and a variety of differently sized guide members may be prepared in advance to accommodate a variety of ICs having different dimensions to be placed on the socket 10.

From the foregoing description, it will be appreciated that if a new IC to be placed on the IC socket 10 is identical in the number and pitch of leads to the preceding IC but is more or less different in size (hence the spacing between the opposed lead arrays are different from that of the preceding IC), it is only required to match the mounting positions of the insulation blocks 12A–12D with respect to the insulation substrate 13 with the size of the new IC. Stated otherwise, the insulation blocks 12A–12D are mounted to a different insulation substrate 13 having through-holes 14 formed at different positions to match the size of the new IC. It is thus to be understood that ICs having the same number and pitch of leads but more or less different size may be tested for their predetermined electrical characteristics by the use of the IC socket constituted with the same insulation blocks 12A–12D simply by replacing the insulation substrate 13. In view of the fact that more or less variations in the IC size are quite likely to occur depending on the IC manufacturer, the IC socket according to the present invention which only requires preparation of inexpensive spare insulation substrates provides great advantages in manufacture and cost.

While four insulation blocks 12A–12D are configured to define a generally rectangular framing in the illustrated embodiment, it is needless to say that the shape of the framing may vary depending on the shape of the IC to be tested, that is, if the IC is of square shape, the framing may also be square, for example.

As will be apparent from the foregoing discussion, according to the present invention in which four contact arrays 11A–11D brought into contact with the leads on four sides, respectively, of an IC are supported in electrical insulation by separate respective insulation blocks 12A–12D which are in turn mounted to an insulation substrate at predetermined positions to complete an IC socket 10, the IC socket may be configured to accommodate varying sizes of ICs simply by changing the mounting positions of the four insulation blocks. This means that the insulation blocks 12A–12D may be used commonly with various sizes of ICs, resulting in greatly reducing the cost of manufacture of the IC socket 10.

In addition, due to the insulation blocks 12A–12D being independent of each other, should some contact or contacts in any of the contact arrays 11A–11D fail in contact or be broken, it would be required to replace only the insulation block having the defective contact array. The IC socket 10 is thus repairable, thereby reducing the running cost. As a result, it becomes possible to reduce the maintenance cost of various equipment utilizing the instant IC socket 10 including the IC testing apparatus.

Furthermore, even if the IC size is significantly different, the same four insulation blocks can be employed as long as the number and pitch of the leads projecting from each side of said IC is the same. And since the opposed insulation blocks are identical in construction and arrangement, only two kinds of insulation blocks need be manufactured. Even though the numbers and pitches of the leads projecting from all of the sides of an IC are not the same, it should further be noted that if the number and pitch of the leads projecting from any side of the IC are the same, the corresponding insulation block may be used, so that it is not required to prepare too many kinds of insulation blocks. Consequently, it is possible to produce insulation blocks of identical construction and arrangement in large quantities, permitting a great reduction in the cost of manufacture.

With regard to the guide member 20, although it is required to prepare as many types of guide members as required to cover varying sizes of ICs as described above, the guide member may be produced at a low cost because it may be entirely molded from resinous material, so that even if there are many types of ICs having different sizes, the manufacture cost of the guide member 20 may be minimized.

What is claimed is:

1. An apparatus comprising:

an IC socket having contacts brought into contact with leads projecting from four sides of a package of a surface-mounted type IC, and comprising:
four insulation blocks separately supporting respective groups of contacts to be contacted with the leads on the respective sides of said surface-mounted type IC, said four insulation blocks assembled together to define a generally quadrilateral framing, each of said four insulation blocks having a generally isosceles trapezoidal shape in plan view and having positioning lug means formed on the bottom surface thereof, each of said groups of contacts being arrayed on the corresponding insulation block along the minor side of the trapezoid with a predetermined pitch, and
an insulation substrate mounting thereon said four insulation blocks at predetermined positions so as to define a generally quadrilateral framing; and a guide member fitting over said IC socket and being a monolithic part molded from insulating resinous material comprising a plate-like insulation element having a generally quadrilateral recess extending inwardly from the bottom thereof and receiving the four insulation blocks in the form of a framing mounted to the insulation substrate of said IC socket, a generally quadrilateral opening formed through the recess and exposing at least the top portions of the contact arrays supported in electrical insulation by said insulation blocks, and guide posts formed at four corners of the opening and extending upwardly therefrom and defining the position of an IC being placed onto said IC socket.

2. The apparatus according to claim 1, wherein said insulation substrate is formed with through-holes at predetermined positions for receiving the positioning lug means of said respective insulation blocks, and said insulation blocks are positioned on said insulation substrate at said predetermined positions by fitting said lug means of said insulation blocks into the corresponding through-holes whereby an IC socket in the form of a generally rectangular framing can be constituted.

* * * * *